United States Patent
Lin et al.

(10) Patent No.: US 11,121,214 B2
(45) Date of Patent: Sep. 14, 2021

(54) SOURCE/DRAIN CONTACT WITH 2-D MATERIAL

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Shih-Yen Lin, Tainan (TW); Kuan-Chao Chen, Tainan (TW); Hsuan-An Chen, Chiayi (TW); Lun-Ming Lee, Kaohsiung (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/548,744

(22) Filed: Aug. 22, 2019

(65) Prior Publication Data

US 2021/0057524 A1   Feb. 25, 2021

(51) Int. Cl.
  *H01L 29/06* (2006.01)
  *H01L 29/24* (2006.01)
  *H01L 21/283* (2006.01)
  *H01L 29/768* (2006.01)
  *H01L 29/66* (2006.01)
  *H01L 29/45* (2006.01)

(52) U.S. Cl.
  CPC ........ *H01L 29/0665* (2013.01); *H01L 21/283* (2013.01); *H01L 29/24* (2013.01); *H01L 29/45* (2013.01); *H01L 29/66969* (2013.01); *H01L 29/768* (2013.01)

(58) Field of Classification Search
  CPC ... H01L 29/0665; H01L 21/283; H01L 29/45; H01L 29/66969; H01L 29/768; H01L 29/24; H01L 29/66431; H01L 29/66462; H01L 29/778–7789; H01L 29/122–127; H01L 29/413
  See application file for complete search history.

(56) References Cited

U.S. PATENT DOCUMENTS

2007/0145480 A1* 6/2007 Cheng ................. H01L 51/0021
                                                              257/347
2016/0300958 A1* 10/2016 Park .................. H01L 29/66969
(Continued)

OTHER PUBLICATIONS

Meng-Yu Lin et al., "Toward epitaxially grown two-dimensional crystal hetero-structures: Single and double MoS2/graphene hetero-structures by chemical vapor depositions", Applied Physics Letters 105, 073501, (2014), 073501-1-073501-5.
(Continued)

*Primary Examiner* — Shahed Ahmed
(74) *Attorney, Agent, or Firm* — Maschoff Brennan

(57) ABSTRACT

A semiconductor device includes a substrate, semiconductor 2-D material layer, a conductive 2-D material layer, a gate dielectric layer, and a gate electrode. The semiconductor 2-D material layer is over the substrate. The conductive 2-D material layer extends along a source/drain region of the semiconductor 2-D material layer, in which the conductive 2-D material layer comprises a group-IV element. The gate dielectric layer extends along a channel region of the semiconductor 2-D material layer. The gate electrode is over the gate dielectric layer.

20 Claims, 9 Drawing Sheets

(56) References Cited

U.S. PATENT DOCUMENTS

| | | | | |
|---|---|---|---|---|
| 2017/0162654 A1* | 6/2017 | Maeda | ............... | H01L 29/78696 |
| 2017/0229576 A1* | 8/2017 | Cho | .................. | H01L 29/78681 |
| 2018/0374962 A1* | 12/2018 | Das | ................... | H01L 29/66969 |
| 2020/0350440 A1* | 11/2020 | Gao | ........................ | H01L 29/16 |

OTHER PUBLICATIONS

Feng-feng Zhu et al., "Epitaxial growth of two-dimensional stanene", Nature Materials vol. 14, Oct. 2015, 1020-1025.

Chung-Huang Lin et al., "Single-layer dual germanene phases on Ag(111)", Physical Review Materials 2, 024003, (Feb. 9, 2018), 024003-1-024003-8.

Hsuan-An Chen et al., "Single-Crystal Antimonene Films Prepared by Molecular Beam Epitaxy: Selective Growth and Contact Resistance Reduction of the 2D Material Heterostructure", ACS Applied Materials & Interfaces, Apr. 23, 2018, 15058-15064.

* cited by examiner

M1

SOURCE/DRAIN CONTACT WITH 2-D MATERIAL

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
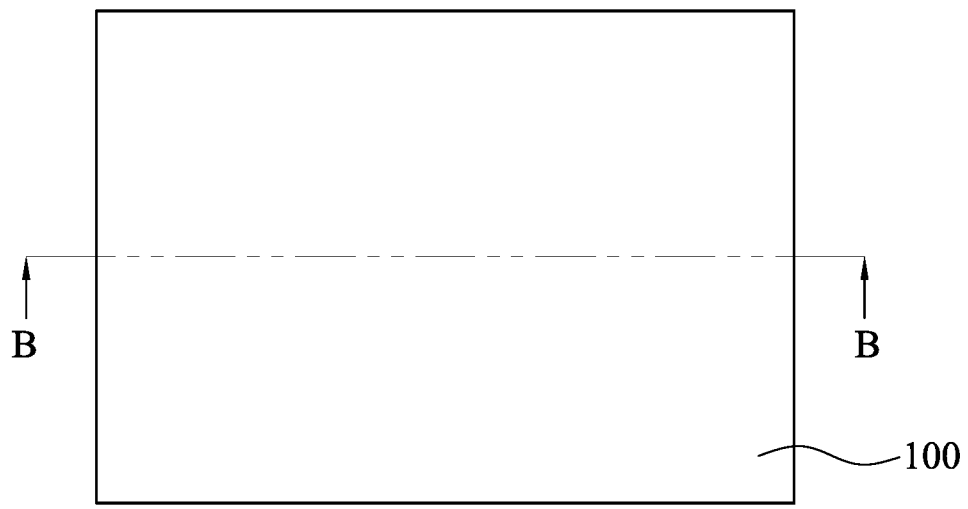
FIGS. 1A to 8B are cross-sectional views of a memory device in various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 8B are cross-sectional views of a memory device in various stages of fabrication in accordance with some embodiments of the present disclosure. Although the views shown in FIGS. 1A to 8B are described with reference to a method, it will be appreciated that the structures shown in FIGS. 1A to 8B are not limited to the method but rather may stand alone separate of the method. Although FIGS. 1A to 8B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 1B:
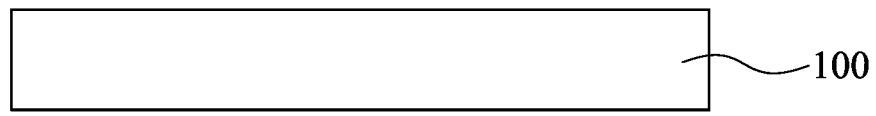

Reference is made to FIGS. 1A and 1B, in which FIG. 1A is a top view of a semiconductor device, and FIG. 1B is a cross-sectional view along line B-B of FIG. 1A. An initial structure includes a substrate 100. In some embodiments, the substrate 100 may function to provide mechanical and/or structure support for features or structures that are formed in the subsequent steps of the process flow illustrated in FIGS. 2A to 8B. These features or structures may be parts or portions of a semiconductor device (e.g. a transistor) that may be formed on or over the substrate 100.

The substrate 100 may be a semiconductor substrate. For example, the substrate 100 may include sapphire (e.g. crystalline $Al_2O_3$), e.g. a large grain or a single crystalline layer of sapphire or a coating of sapphire. As another example, the substrate 100 may be a sapphire substrate, e.g. a transparent sapphire substrate comprising, as an example, $\alpha$-$Al_2O_3$. Other elementary semiconductors like germanium may also be used for substrate 100. Alternatively or additionally, substrate 100 includes a compound semiconductor such as silicon carbide, gallium arsenide, indium arsenide, indium gallium arsenide (InGaAs) and/or indium phosphide. Further, substrate 100 also includes a silicon-on-insulator (SOI) structure. Substrate 100 may also be other suitable substrates, which are all included in the disclosure and non-limiting. Substrate 100 may include an epitaxial layer and/or may be strained for performance enhancement. Substrate 100 may also include various doping configurations depending on design requirements, such as p-type substrate and/or n-type substrate and various doped regions such as p-wells and/or n-wells.

Figure 2A:
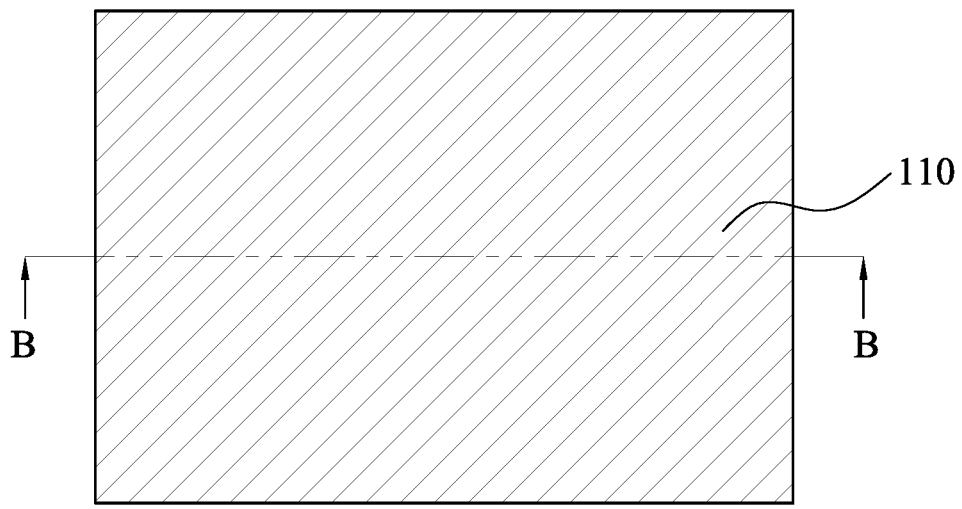
Figure 2B:
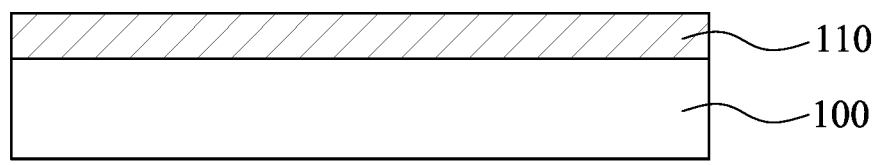

Reference is made to FIGS. 2A and 2B, in which FIG. 2A is a top view of a semiconductor device, and FIG. 2B is a cross-sectional view along line B-B of FIG. 2A. A first 2-D material layer 110 is formed over the substrate 100. In some embodiments, the first 2-D material layer 110 is in direct contact with the substrate 100. As used herein, consistent with the accepted definition within solid state material art, a "2-D material" refers to a crystalline material consisting of a single layer of atoms. As widely accepted in the art, "2-D material" may also be referred to as a "monolayer" material. In this disclosure, "2-D material" and "monolayer" material are used interchangeably without differentiation in meanings, unless specifically pointed out otherwise.

The first 2D material layer 110 may be 2D materials of suitable thickness. In some embodiments, a 2D material includes a single layer of atoms in each of its monolayer structure, so the thickness of the 2D material refers to a number of monolayers of the 2D material, which can be one monolayer or more than one monolayer. The coupling between two adjacent monolayers of 2D material includes van der Waals forces, which are weaker than the chemical bonds between/among atoms within the single monolayer.

As the first 2-D material layer 110 is provided for the growth of a second 2-D material layer (e.g., the second 2-D material layer 160A of FIG. 5B) thereover, in some embodiments, top surface of the first 2-D material layer 110 includes no vertical bonding among atoms, at least for the portions of top the first 2-D material layer 110 where a second layer of a second 2-D material layer will be grown.

Forming of the first 2-D material layer 110 may include suitable processes depending on the specific the first 2-D material layer 110 and the specific substrate 100. In some embodiments, the first 2-D material layer 110 includes a transition metal dichacogenide (TMD) monolayer material. In some embodiments, a TMD monolayer includes one layer of transition metal atoms sandwiched between two layers of chalcogen atoms. Substrate 100 may include any substrates that are suitable for the formation of the TMD monolayers thereover. For example, substrate 100 may be selected based on its capacity to sustain the potential high temperature in the formation of the TMD monolayers thereover. In some embodiments, a sapphire substrate 100 is used.

In some embodiment where the first 2-D material layer 110 is TMD monolayers, the TMD monolayers include molybdenum disulfide ($MoS_2$). $MoS_2$ may be formed on the substrate 100, e.g., a sapphire substrate, using suitable approaches and all are included. For example, $MoS_2$ may be obtained through micromechanical exfoliation and coupled over the substrate 100, or by sulfurizing a pre-deposited molybdenum (Mo) film over the substrate 100.

In some other embodiments where $MoS_2$ is formed by micromechanical exfoliation, the first 2-D material layer 110 is formed on another substrate and then transferred to the substrate 100. For example, a 2-D material film is formed on a first substrate by chemical vapor deposition (CVD), sputtering or atomic layer deposition in some embodiments. A polymer film, such as poly(methyl methacrylate) (PMMA), is subsequently formed on the 2-D material film. After forming the polymer film, the sample is heated, such as by placing the sample on a hot plate. Subsequent to heating, a corner of the 2-D material film is peeled off the first substrate, such as by using a tweezers, and the sample is submerged in a solution to facilitate the separation of the 2-D material film from the first substrate. The 2-D material film and polymer film are transferred to the substrate 100. The polymer film is then removed from the 2-D material film using a suitable solvent.

In some embodiments where $MoS_2$ is formed by sulfurizing a pre-deposited molybdenum (Mo) film over the substrate 100, a Mo film may be deposited over the sapphire substrate 100, by suitable process, such as using RF sputtering with a molybdenum target to form the Mo film on the substrate 100. During the Mo film deposition procedure, the sputtering power is kept at about 35 W to about 45 W and the background pressure is kept at about $4.5 \times 10^{-3}$ torr to about $5.5 \times 10^{-3}$ torr with about 35 sccm to about 45 sccm Ar gas flow. After the Mo film is deposited, the sapphire substrate 100 as well as the Mo film are moved out of the sputtering chamber and exposed to air. As a result, the Mo film will be oxidized and form Mo oxides. Then, the sample is placed in the center of a hot furnace for sulfurization. Before sulfurization, a tube of hot furnace the is pumped down to about $4.5 \times 10^{-3}$ torr to about $5.5 \times 10^{-3}$ torr to evacuate gas molecular such as oxygen from the environment. During the sulfurization procedure, Ar gas at a flow rate of from about 40 sccm to about 200 sccm is used as a carrier gas, and the furnace pressure ranges from about 0.1 Torr to about 10 Torr. The growth temperature for the sample is kept at about 400° C. to about 1200° C. with the S powder placed on the upstream of the gas flow. About 0.5 g to about 2 g of S powder is heated in the gas flow stream to its evaporation temperature at about 120° C. to about 200° C. upstream of the furnace. During the high-temperature growth procedure, the Mo oxide segregation and the sulfurization reaction will take place simultaneously. If the background sulfur is sufficient, the sulfurization reaction will be the dominant mechanism. Most of the surface Mo oxides will be transformed into $MoS_2$ in a short time. As a result, a uniform planar $MoS_2$ film will be obtained on the sapphire substrate after the sulfurization procedure. With this process, the first 2-D material layer 110 can be uniformly formed on a large-area of the substrate 100. In some embodiments, the area of the first 2-D material layer 110 is in a range of about 0.1 $mm^2$ to about 50 $mm^2$.

In some embodiments, forming of the first 2-D material layer 110 also includes treating the first 2-D material layer 110 to obtain expected electronic properties of the first 2-D material layer 110. The treating processes include thinning (namely, reducing the thickness of the first 2-D material layer 110), doping, or straining, to make the first 2-D material layer 110 exhibit certain semiconductor properties, e.g., including direct bandgap. The thinning of the first 2-D material layer 110 may be achieved through various suitable processes, and all are included in the present disclosure. For example, plasma based dry etching, e.g., reaction-ion etching (RIE), may be used to reduce the number of monolayers of the first 2-D material layer 110.

In the description hereinafter, the first 2-D material layer 110 of a thin film of $MoS_2$ having semiconductor properties (interchangeably referred to as semiconductor 2-D material layer in this context) is used as an illustrative example for descriptive purposes. Each monolayer of $MoS_2$ is about 6.5 angstrom (Å) to 7.5 Å in thickness (e.g., 7.0 Å). In some embodiments, the first 2-D material layer 110 of $MoS_2$ is less than 1.5 nm in thickness, namely equal to or less than two monolayers of $MoS_2$ (bi-layer). It should be understood that other TMDs like molybdenum diselenide ($MoSe_2$) or other 2D materials like group V monolayers arsenene (As) and phosphorene ($\alpha$-P) are also candidates for the first 2-D material layer 110.

Figure 3A:
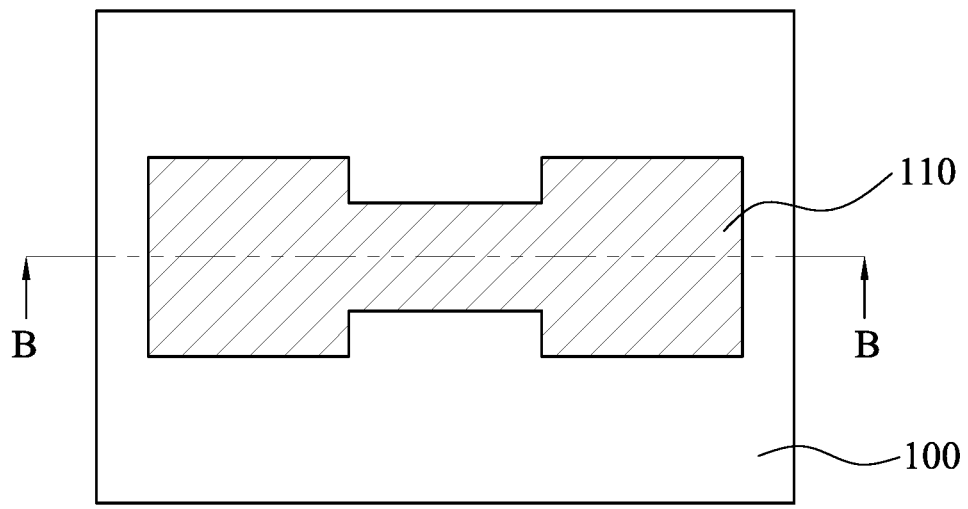
Figure 3B:
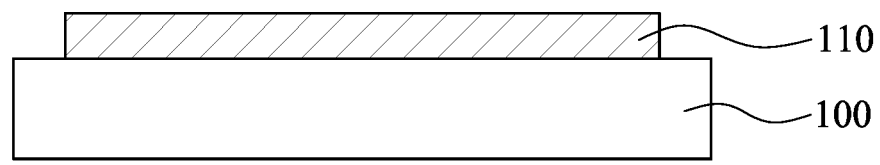

Reference is made to FIGS. 3A and 3B, in which FIG. 3A is a top view of a semiconductor device, and FIG. 3B is a cross-sectional view along line B-B of FIG. 3A. The first 2-D material layer 110 is patterned. In some embodiments, the patterning process includes a photolithography process and an etching process to remove portions of the first 2-D material layer 110.

Figure 4A:
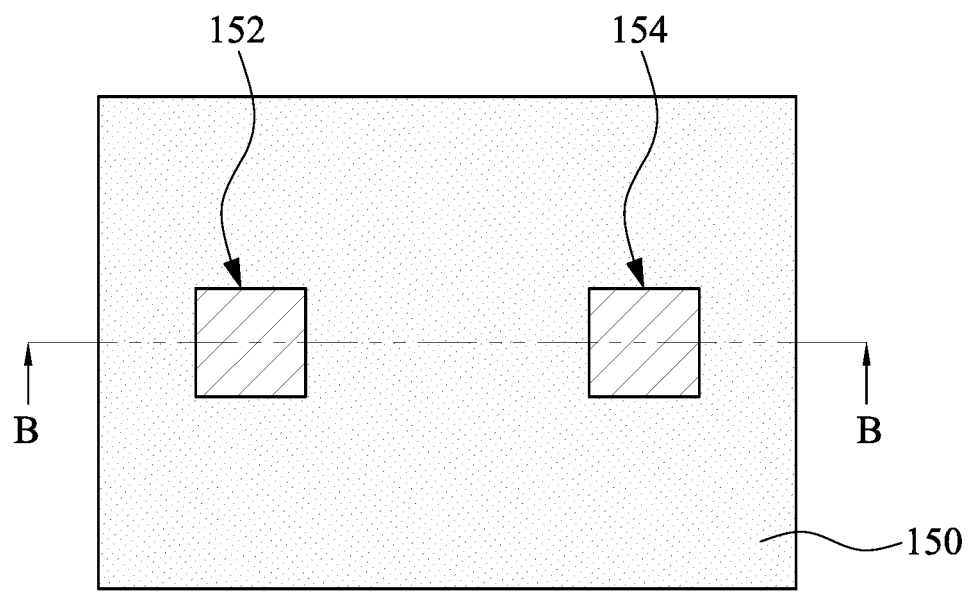
Figure 4B:
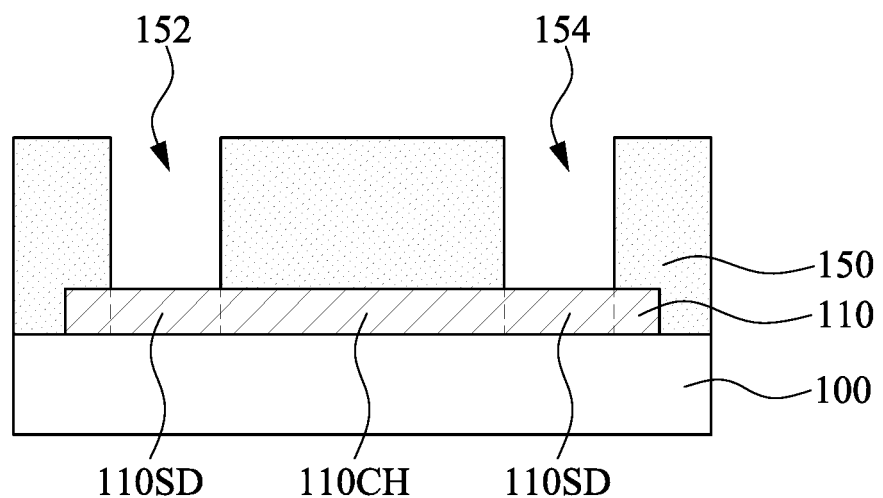

Reference is made to FIGS. 4A and 4B, in which FIG. 4A is a top view of a semiconductor device, and FIG. 4B is a cross-sectional view along line B-B of FIG. 4A. A mask layer 150 is formed over the substrate 100 and the first 2-D material layer 110. In some embodiments, the mask layer 150 is patterned to form openings 152 and 154 exposing portions of the top surface of the first 2-D material layer 110. In some embodiments, the mask layer 150 includes a photoresist material. In some embodiments, portions of the first 2-D material layer 110 exposed by the openings 152 and 154 can be referred to as source/drain regions 110SD, and a portion of the first 2-D material layer 110 between the source/drain regions 110SD can be referred to as channel region 110CH.

In some embodiments, the mask layer 150 can be formed by depositing a photoresist layer over the substrate 100 by suitable process, such as spin-coating technique, which may include baking the photoresist layer after coating. The photoresist layer may include positive-type or negative-type resist materials. For example, the photoresist layer include poly(methylmethacrylate) (PMMA). Then, the photoresist layer is subjected to an exposure process. For example, the photoresist layer is exposed to radiation energy, such as ultraviolet (UV) radiation, through a mask (photomask or reticle) having a predefined pattern (e.g., pattern that defines the positions of the openings 152 and 154), resulting in a photoresist pattern that includes exposed regions of the photoresist layer. The radiation energy may use krypton fluoride (KrF) excimer laser or argon fluoride (ArF) excimer laser. Thereafter, the photoresist layer may be subjected to a post-exposure bake (PEB) process. Afterward, the photoresist layer is developed by a suitable process. For example, the photoresist layer is exposed to a developing solution, such as tetramethylammonium hydroxide (TMAH), to remove portions of the photoresist layer to form the openings 152 and 154 that expose the top surface of the first 2-D material layer 110. Thereafter, a rinsing process, such as a de-ionized (DI) water rinse, may be performed. The patterned photoresist layer is referred to the mask layer 150.

Figure 5A:
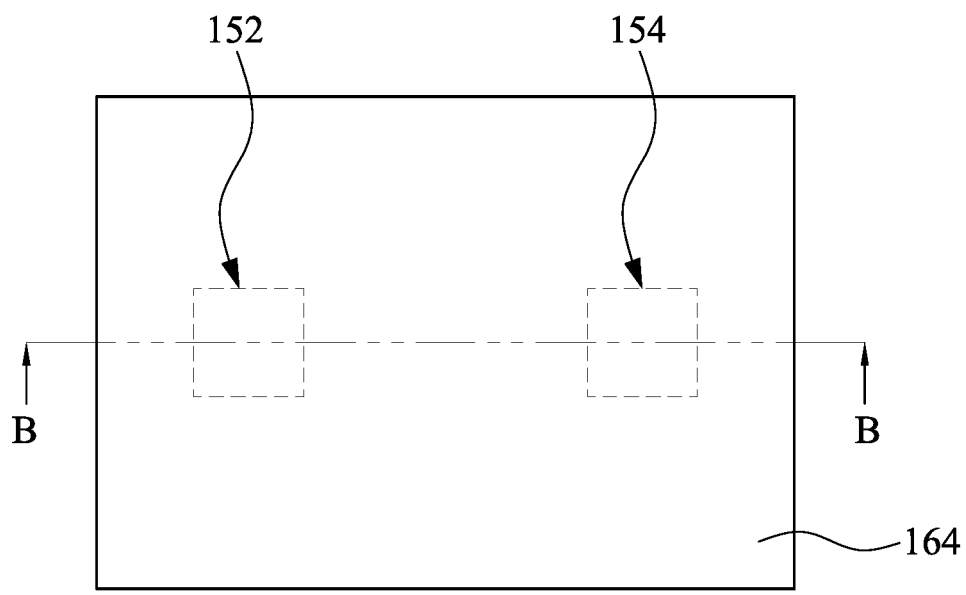
Figure 5B:
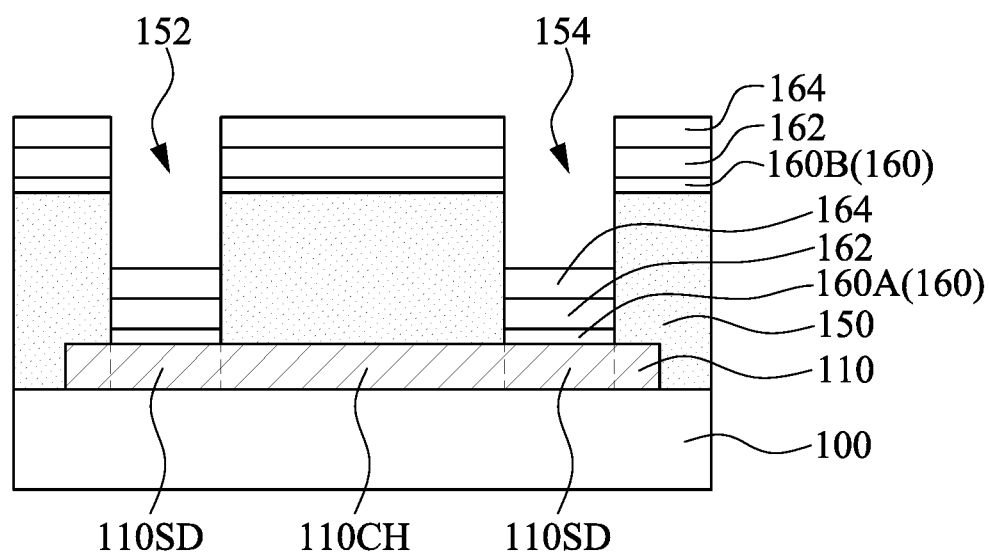

Reference is made to FIGS. 5A and 5B, in which FIG. 5A is a top view of a semiconductor device, and FIG. 5B is a cross-sectional view along line B-B of FIG. 5A. A contact layer 160, a separation metal layer 162, and an electrode metal layer 164 are sequentially formed in the openings 152 and 154. On the other hand, the contact layer 160, the separation metal layer 162, and the electrode metal layer 164 are formed over a top surface of the mask layer 150.

In some embodiments, the contact layer 160 includes a first portion 160A disposed in the openings 152 and 154 and extends along the source/drain regions 110SD of the first 2-D material layer 110, and a second portion 160B disposed on and extends along the top surface of the mask layer 150. In some embodiments, the first portion 160A and the second portion 160B are made of the same material, while the first portion 160A and the second portion 160B have different crystalline structures. For example, the first portion 160A of the contact layer 160 has a 2-D crystalline structure, and the second portion 160B of the contact layer 160 has a 3-D crystalline structure. In some embodiments, the first portion 160A of the contact layer 160 can also be referred to as second 2-D material layer 160A. In some embodiments, the first portion 160A of the contact layer 160 is thinner than the separation metal layer 162 and the electrode metal layer 164. In some embodiments, the first portion 160A of the contact layer 160 is thinner than the first 2-D material layer 110. Here, the term "3-D crystalline structure" indicates a structure has regular arrangements of atoms in three dimensions represented by a repeated unit cell, in which the unit cell is the smallest three dimensions repeating unit showing the full symmetry of the crystalline structure. On the other hand, a "2-D material" indicates a structure has regular arrangements of atoms in two dimensions.

In some embodiments, the contact layer 160 may be formed by a thermal evaporation process. During the thermal evaporation process, the pressure of the system is kept from about $5 \times 10^{-7}$ torr to about $7 \times 10^{-7}$ torr (e.g., $6 \times 10^{-7}$ torr), and the deposition rate is about 0.4 Å/sec to about 0.6 Å/sec (e.g., 0.5 Å/sec). In some embodiments, the contact layer 160 is formed at a temperature from about 25° C. (room temperature) to about 500° C. If the temperature is greater than about 500° C., the 2-D crystal structure of the first 2-D material layer 110, such as $MoS_2$, may be destroyed due to high temperature. On the other hand, if the temperature is less than about 25° C., the quality of the second 2-D material layer 160A may be unsatisfied.

In some embodiments, the contact layer 160 may be formed by molecular beam epitaxy (MBE) growth procedure or e-gun evaporation. The sample may be transferred to a MBE system for forming the contact layer 160. MBE takes place in high vacuum or ultra-high vacuum. The deposition rate of MBE that allows the films to grow epitaxially. These deposition rates require proportionally better vacuum to achieve the same impurity levels as other deposition techniques. The absence of carrier gases, as well as the ultra-high vacuum environment, results in the highest achievable purity of the grown films. Accordingly, by using MBE growth procedure, the contact layer 160 made of single element may be achieved.

In some embodiments, the second 2-D material layer 160A includes group-IV materials, such as germanium (Ge), tin (Sn), plumbum (Pb), etc. In some embodiments, the second 2-D material layer 160A behaves like topological insulators with possible room-temperature superconducting properties at the edges thereof. Specifically, germanene and stanene are the 2-D allotrope of, germanium (Ge), and tin (Sn), respectively. A topological insulator behaves like an insulator in its interior while exhibiting conductive properties at the boundary portions thereof (e.g., the surfaces of a bulk or edges of a film), meaning that charge carriers can only move along the boundary portion of the material. Particularly, it has been shown that 2-D tin (stanene) behaves like a topological insulator with possible room-temperature superconducting properties at the edges of the stanene ribbons, which makes the second 2-D material layer 160A a candidate of source/drain contact material (interchangeably referred to as conductive 2-D material layer in this context). In some embodiments, the first 2-D material layer 110 and the second 2-D material layer 160A have different materials. For example, the first 2-D material layer 110 may be $MoS_2$, and the second 2-D material layer 160A may be stanene, germanene, or other 2-D materials including group-IV elements.

In some embodiments where the second 2-D material layer 160A is stanene, each of the monolayer of the second 2-D material layer 160A has a thickness in a range of about 2.6 Å to about 3.2 Å. For example, the thickness of stanene monolayer is about 2.9 Å detected by High Resolution Transmission Electron Microscope (HRTEM). Alternatively, the thickness of stanene monolayer can be extracted from the two peaks in the X-ray diffusion (XRD) curves of the second 2-D material layer 160A and Bragg's law ($n\lambda=2d \sin \theta$), and the extracted thickness of stanene monolayer is about 2.8 Å. In some embodiments, the second 2-D material layer 160A of stanene is less than or equal to about 50 nm in thickness, namely equal to or less than 170 monolayers of stanene.

In some embodiments where the second 2-D material layer 160A is germanene, each of the monolayer of the second 2-D material layer 160A has a thickness in a range of about 3.0 Å to about 3.6 Å. For example, the thickness of stanene monolayer is about 3.3 Å detected by High Resolution Transmission Electron Microscope (HRTEM). Alternatively, the thickness of stanene monolayer can be extracted from the two peaks in the X-ray diffusion (XRD) curves of the second 2-D material layer 160A and Bragg's law ($n\lambda=2d \sin \theta$), and the extracted thickness of stanene monolayer is about 3.2 Å. In some embodiments, the second 2-D material layer 160A of germanene is less than or equal to about 50 nm in thickness, namely equal to or less than 150 monolayers of germanene.

In some embodiments, the first portion 160A of the contact layer 160 tends to be formed with a 2-D crystalline structure over the first 2-D material layer 110. Because layers of 2-D materials along a through-plane direction (i.e., the direction perpendicular to the largest surface of the 2-D material layer) are coupled by weak van der Waals force. As a result, there is no chemical bond between the first 2-D material layer 110 and the first portion 160A of the contact layer 160. The van der Waals epitaxy of 2-D materials onto other 2-D materials may be not hindered by the large lattice mismatch between the two 2-D material layers (i.e., the first 2-D material layer 110 and the second 2-D material layer 160A). Therefore, it may be possible to grow large-area of second 2-D material layer 160A onto the first 2-D material layer 110 (e.g., 2-D material layer of $MoS_2$). In addition, selective growth is also achieved by using this growth technique, such as MBE.

On the other hand, because the mask layer 150 is formed of polymer materials, such as poly(methylmethacrylate) (PMMA), which is not a 2-D material layer. Therefore, the second portion 160B of the contact layer 160 tends to be formed in a 3-D crystalline structure on the mask layer 150. In some embodiments, the second portion 160B includes group-IV materials, such as germanium (Ge), tin (Sn), plumbum (Pb), etc.

In some embodiments, the separation metal layer 162 is used to separate the second 2-D material layer 160A from the electrode metal layer 164, such that the electrode metal layer 164 would not contact the second 2-D material layer 160A. In some embodiments where the separation metal layer 162 is omitted, the second 2-D material layer 160A would extend along the electrode metal layer 164. However, the electrode metal layer 164 may form alloy with the second 2-D material layer 160A during deposition of the electrode metal layer 164, which might deteriorate the 2-D crystal structure of the second 2-D material layer 160A. Without 2-D crystal structure, the contact resistance might be increased to an unsatisfactory value. Accordingly, the material of the separation metal layer 162 is selected such that the material would not form an alloy with the second 2-D material layer 160A. In some embodiments, the separation metal layer 162 may include metal such as aluminum (Al), bismuth (Bi), cadmium (Cd), chromium (Cr), iridium (Ir), niobium (Nb), tantalum (Ta), tellurium (Te), tungsten (W), or other suitable metal. The above mentioned metal would not form an alloy with the second 2-D material layer 160A during deposition of the separation metal layer 162.

In some embodiments, the electrode metal layer 164 may be formed of suitable electrically conductive material, including polysilicon, graphene, and metal including one or more layers of aluminum (Al), copper (Cu), titanium (Ti), tantalum (Ta), tungsten (W), cobalt (Co), molybdenum (Mo), nickel (Ni), manganese (Mg), silver (Ag), palladium (Pd), rhenium (Re), iridium (Ir), ruthenium (Ru), platinum (Pt), zirconium (Zr), tantalum nitride (TaN), nickel silicide (NiSi), cobalt silicide (CoSi), TiN, WN, TiAl, TiAlN, TaCN, TaC, TaSiN, metal alloys, other suitable materials, and/or combinations thereof. In some other embodiments, the electrode metal layer 164 may include material that may form alloy with the material of the second 2-D material layer 160A, such as indium (In), plumbum (Pb), copper (Cu), silver (Ag), gold (Au), nickel (Ni), platinum (Pt), cobalt (Co), rhodium (Rh), ferrum (Fe), ruthenium (Ru), manganese (Mn), molybdenum (Mo), Vanadium (V), titanium (Ti), zirconium (Zr), hafnium (Hf), Magnesium (Mg). In some embodiments, the electrode metal layer 164 can be referred to as source/drain contact.

In some embodiments, the separation metal layer 162 and the electrode metal layer 164 can be formed by suitable process, such as multiple-chamber physical vapor deposition (PVD) system. In other embodiments, low temperature sputtering can be used to form the separation metal layer 162 and the electrode metal layer 164. In some embodiments, the mask layer 150 is substantially thicker than the stacked layers of the second 2-D material layer 160A, the separation metal layer 162, and the electrode metal layer 164, so that the stacked layers of second 2-D material layer 160A, the separation metal layer 162, and the electrode metal layer 164 in the openings 152 and 154 can be separated from the separation metal layer 162 and the electrode metal layer 164 over the top surface of the mask layer 150.

Figure 6A:
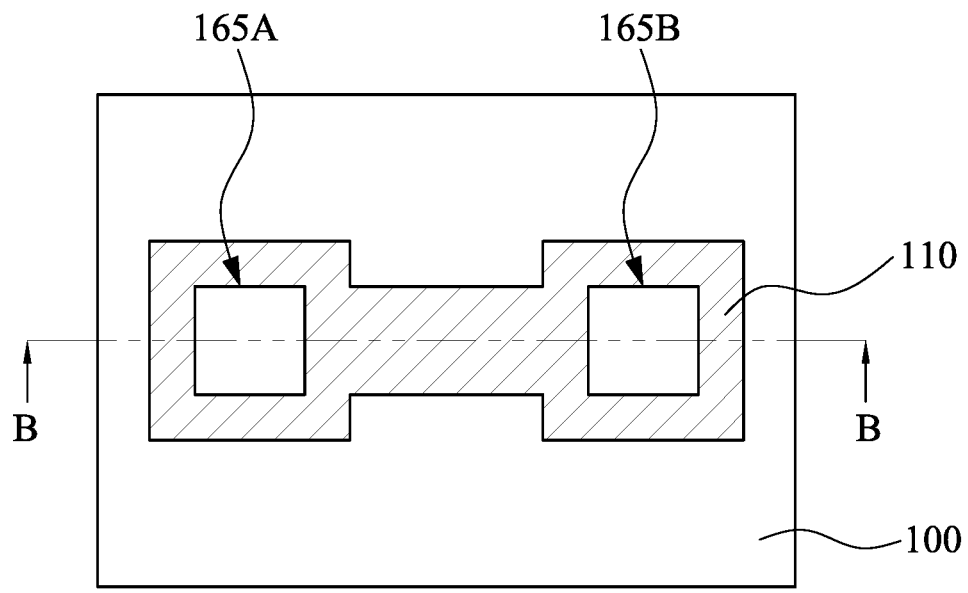
Figure 6B:
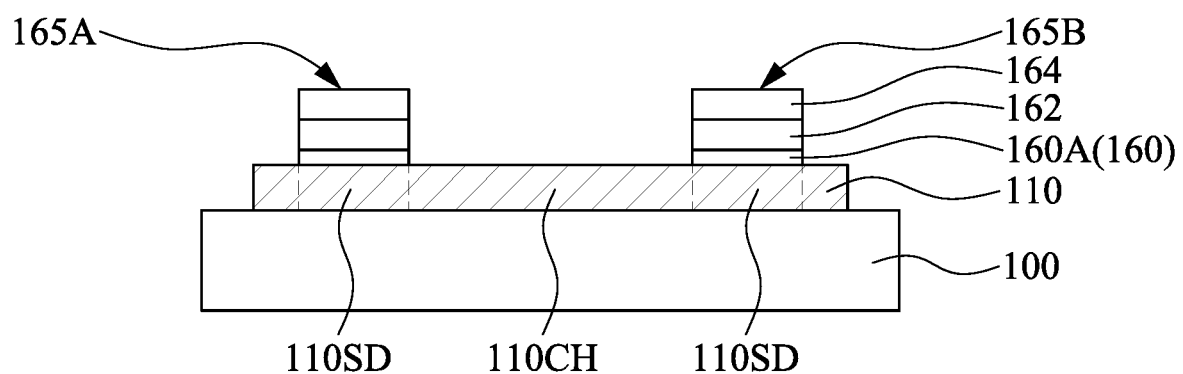

Reference is made to FIGS. 6A and 6B, in which FIG. 6A is a top view of a semiconductor device, and FIG. 6B is a cross-sectional view along line B-B of FIG. 6A. The mask layer 150 is removed, leaving the second 2-D material layer 160A, the separation metal layer 162 and the electrode metal layer 164 over the top surface of the first 2-D material layer 110. In greater detail, the second portion 160B of the contact layer 160 and the overlying separation metal and electrode metal are removed together with the mask layer 150. After the mask layer 150 is removed, a first source/drain contact 165A and a second source/drain contact 165B are formed. In some embodiments, each of the first source/drain contact 165A and the second source/drain contact 165B includes the second 2-D material layer 160A, the separation metal layer 162 and the electrode metal layer 164.

The second 2-D material layer 160A of the first and second source/drain contacts 165A/165B is in direct contact with the first 2-D material layer 110. In some embodiments, the contact resistance between the second 2-D material layer 160A and the first 2-D material layer 110 is lower than that between a metal and first 2-D material layer 110. Accordingly, by using a source/drain contact having a 2-D material layer that extends along a source/drain region of a 2-D material layer, the contact resistance between the source/drain contact and the source/drain region can be reduced, which will improve the device performance.

In some embodiments, the process shown in FIGS. 5A to 6B can be referred to as a lift-off process. For example, the substrate 100 is immersed into a tank of appropriate solvent that will react with the mask layer 150. The mask layer 150 swells, dissolves, and lifts off the second portion 160B of the contact layer 160, the separation metal layer 162 and the electrode metal layer 164 above the surface of the resist mask layer 150, leaving second 2-D material layer 160A, the separation metal layer 162 and the electrode metal layer 164 to remain over the first 2-D material layer 110. The resulting structure is shown in FIGS. 6A and 6B.

In some embodiments, because the patterns of the second 2-D material layer 160A, the separation metal layer 162 and the electrode metal layer 164 are defined by the same mask layer 150, the respective edges (or sidewalls) of the second 2-D material layer 160A, the separation metal layer 162 and the electrode metal layer 164 are substantially vertically aligned and are substantially co-terminus.

Any residual mask layer 150 may be optionally cleaned by another solvent or by appropriate plasma chemistry to control defect density. Examples of suitable solvents include xylene and methyl iso-butyl ketone (MIBK). In some embodiments, this process be carded out in an ultrasonic bath with agitation to enhance the lift-off of undesirable metalization.

Figure 7A:
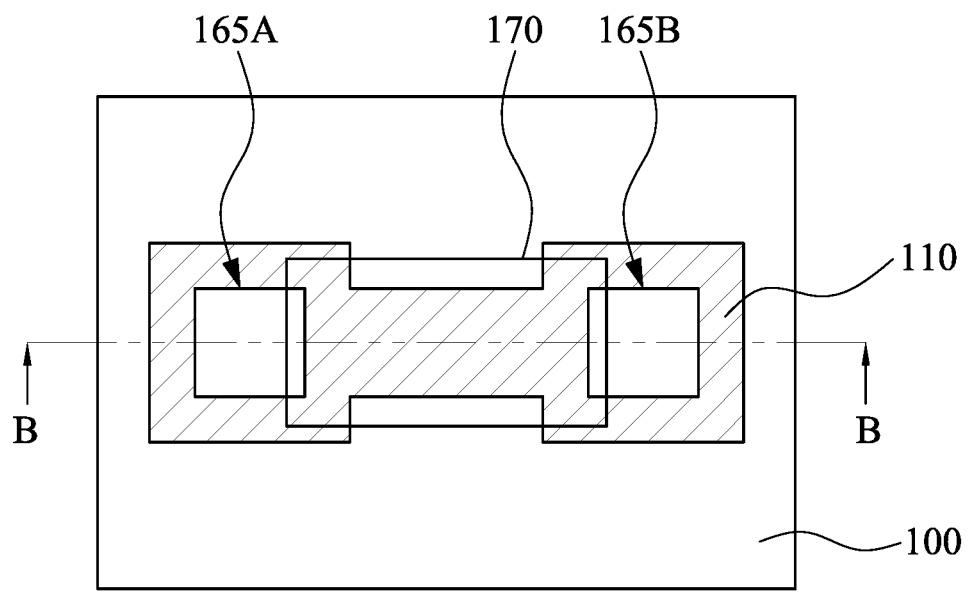
Figure 7B:
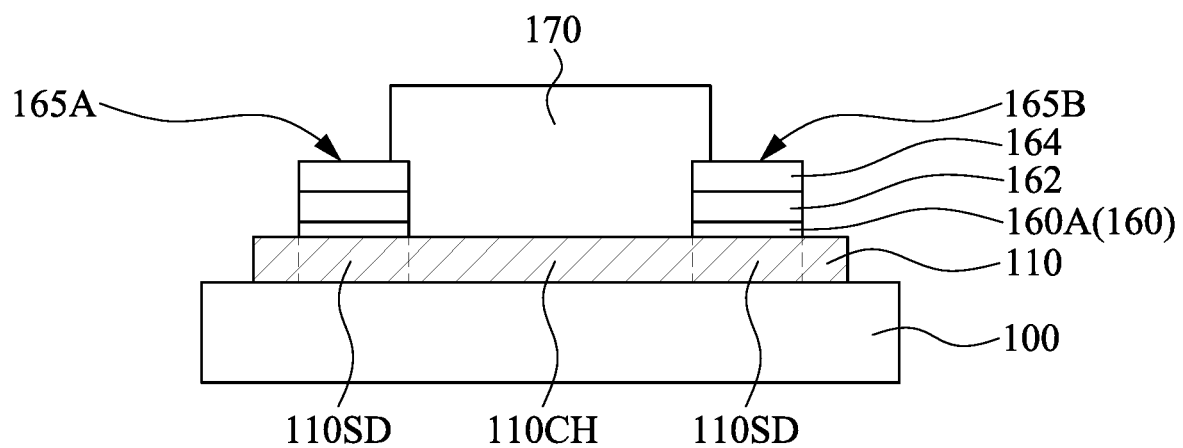

Reference is made to FIGS. 7A and 7B, in which FIG. 7A is a top view of a semiconductor device, and FIG. 7B is a cross-sectional view along line B-B of FIG. 7A. A gate dielectric layer 170 is formed over the channel region 110CH of the first 2-D material layer 110, the first source/drain contact 165A, and the second source/drain contact 165B. In some embodiments, the gate dielectric layer 170 extends along portions of the top surfaces of the first source/drain contact 165A and the second source/drain contact 165B, while leaving other portions of the top surfaces of the first source/drain contact 165A and the second source/drain contact 165B exposed. In some embodiments, the gate dielectric layer 170 extends along the sidewalls of the first source/drain contact 165A and the second source/drain contact 165B. In some embodiments, the gate dielectric layer 170 is extends along an entire surface of the first 2-D material layer 110 between the first source/drain contact 165A and the second source/drain contact 165B.

The gate dielectric layer 170 can be formed by, for example, depositing a dielectric material layer blanket over the substrate 100, and followed by a patterning process to remove portions of the dielectric material layer. The resulting structure is shown in FIGS. 7A and 7B.

The gate dielectric layer 170 includes silicon oxide, silicon oxynitride, a combination thereof, or another suitable material. In some embodiments, the gate dielectric layer 170 includes a high dielectric constant material (high-k material), in accordance with some embodiments. The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 170 is formed using a chemical vapor deposition process or another suitable process.

Figure 8A:
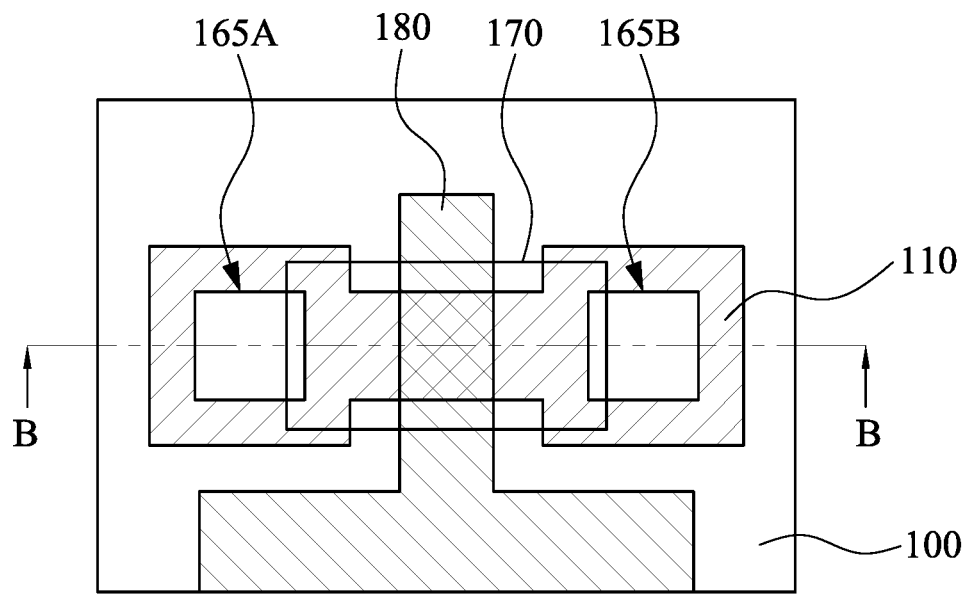
Figure 8B:
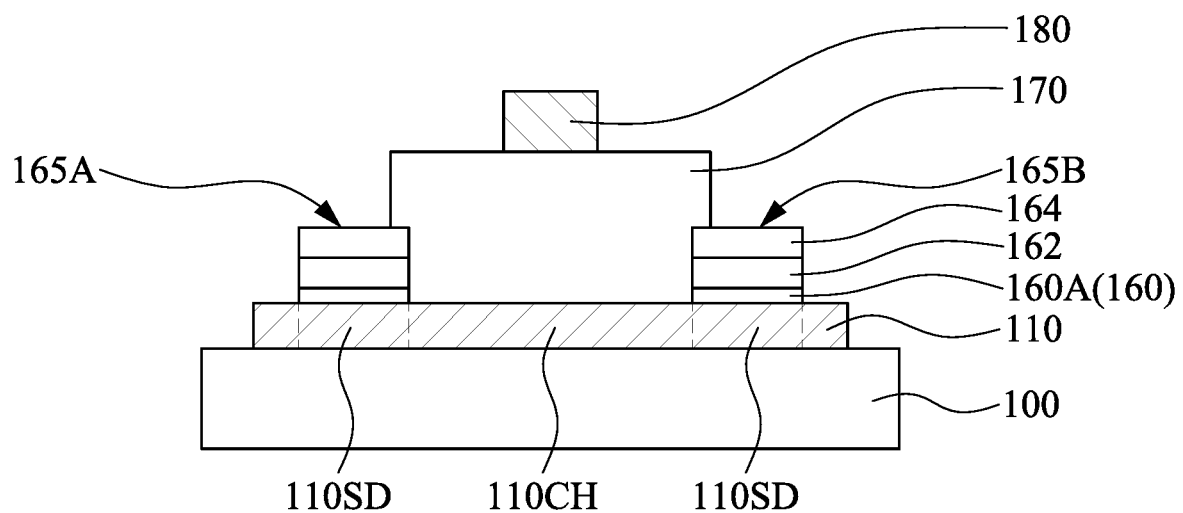

Reference is made to FIGS. 8A and 8B, in which FIG. 8A is a top view of a semiconductor device, and FIG. 8B is a cross-sectional view along line B-B of FIG. 8A. A gate electrode 180 is formed over the gate dielectric layer 170. The gate electrode 180 can be formed of suitable electrically conductive material, including polysilicon, graphene, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The gate electrode 180 may be formed by one or more deposition processes, such as chemical vapor deposition (CVD), atomic layer deposition (ALD), physical vapor deposition (PVD) (sputtering), electroplating, and/or other suitable method, followed by one or more etching process to pattern the deposited materials of gate electrode 180.

Figure 9:
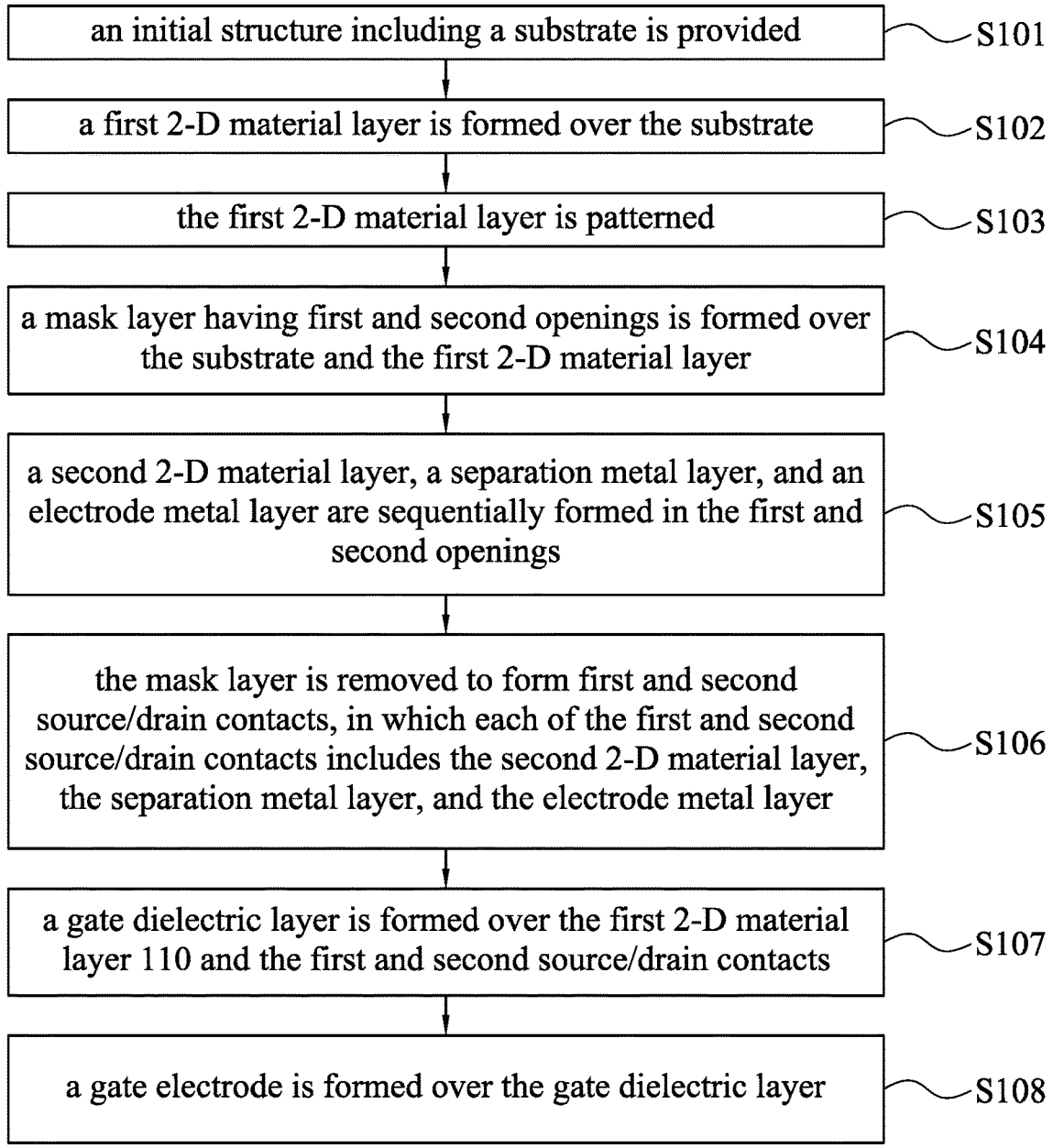
FIG. 9 illustrates a method of forming a semiconductor device in accordance with some embodiments of the present disclosure.

FIG. 9 illustrates a method M1 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, an initial structure including a substrate is provided. FIGS. 1A and 1B respectively illustrate a top view and a cross-sectional view of some embodiments corresponding to act in block S101.

At block S102, a first 2-D material layer is formed over the substrate. FIGS. 2A and 2B respectively illustrate a top view and a cross-sectional view of some embodiments corresponding to act in block S102.

At block S103, the first 2-D material layer is patterned. FIGS. 3A and 3B respectively illustrate a top view and a cross-sectional view of some embodiments corresponding to act in block S103.

At block S104, a mask layer having first and second openings is formed over the substrate and the first 2-D material layer. FIGS. 4A and 4B respectively illustrate a top view and a cross-sectional view of some embodiments corresponding to act in block S104.

At block S105, a second 2-D material layer, a separation metal layer, and an electrode metal layer are sequentially formed in the first and second openings. FIGS. 5A and 5B respectively illustrate a top view and a cross-sectional view of some embodiments corresponding to act in block S105.

At block S106, the mask layer is removed to form first and second source/drain contacts, in which each of the first and second source/drain contacts includes the second 2-D material layer, the separation metal layer, and the electrode metal layer. FIGS. 6A and 6B respectively illustrate a top view and a cross-sectional view of some embodiments corresponding to act in block S106.

At block S107, a gate dielectric layer is formed over the first 2-D material layer 110 and the first and second source/drain contacts. FIGS. 7A and 7B respectively illustrate a top view and a cross-sectional view of some embodiments corresponding to act in block S107.

At block S108, a gate electrode is formed over the gate dielectric layer. FIGS. 8A and 8B respectively illustrate a top view and a cross-sectional view of some embodiments corresponding to act in block S108.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that a source/drain contact having a 2-D material conductive layer is formed extending along a source/drain region of a 2-D material semiconductor layer, so as to reduce the contact resistance between the source/drain contact and the source/drain region of the 2-D material semiconductor layer, which will improve the device performance. Another advantage is that the 2-D material of the source/drain contact is formed under a temperature that would not destroy the 2-D crystal structure of the 2-D material semiconductor layer, which will improve the device reliability.

In some embodiments of the present disclosure, a semiconductor device includes a substrate, semiconductor 2-D material layer, a conductive 2-D material layer, a gate dielectric layer, and a gate electrode. The semiconductor 2-D material layer is over the substrate. The conductive 2-D material layer extends along a source/drain region of the semiconductor 2-D material layer, in which the conductive 2-D material layer comprises a group-IV element. The gate dielectric layer extends along a channel region of the semiconductor 2-D material layer. The gate electrode is over the gate dielectric layer.

In some embodiments of the present disclosure, a semiconductor device includes a substrate, a semiconductor 2-D layer, a source/drain contact, a gate dielectric layer, and a gate electrode. The semiconductor 2-D layer is over the substrate. The source/drain contact has a bottom layer extends along a source/drain region of the semiconductor 2-D layer, in which the bottom layer of the source/drain contact is made of a 2-D allotrope of group-IV element. The gate dielectric layer extends along a channel region of the semiconductor 2-D layer. The gate electrode is over the gate dielectric layer.

In some embodiments of the present disclosure, a method includes forming a first 2-D material layer over a substrate; forming a mask layer over the first 2-D material layer; patterning the mask layer to form an opening in the mask layer to expose the first 2-D material layer; forming a layer of group-IV element over the mask layer and in the opening, in which the layer of group-IV element has a first portion extending along the first 2-D material layer and a second portion extending along a top surface of the mask layer, and the first portion and the second portion have different crystalline structures; removing the mask layer and the second portion of the layer of group-IV element; forming a gate dielectric layer over the first 2-D material layer; and forming a gate electrode over the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a semiconductor 2-D material layer over the substrate;
   a conductive 2-D material layer extending along a source/drain region of the semiconductor 2-D material layer, wherein the conductive 2-D material layer comprises a group-IV element;
   a metal stack overlapping an entirety of the conductive 2-D material layer;
   a gate dielectric layer extending along a channel region of the semiconductor 2-D material layer; and
   a gate electrode over the gate dielectric layer.

2. The semiconductor device of claim 1, wherein the group-IV element is stanene or germanene.

3. The semiconductor device of claim 1, wherein the semiconductor 2-D material layer comprises $MoS_2$.

4. The semiconductor device of claim 1, wherein the metal stack comprises:
   a separation metal layer extending along a top surface of the conductive 2-D material layer; and
   an electrode metal layer extending along a top surface of the separation metal layer.

5. The semiconductor device of claim 4, wherein the separation metal layer comprises aluminum (Al), bismuth (Bi), cadmium (Cd), chromium (Cr), iridium (Ir), niobium (Nb), tantalum (Ta), tellurium (Te), or tungsten(W).

6. The semiconductor device of claim 4, wherein the gate dielectric layer further extends along a sidewall of the conductive 2-D material layer, a sidewall of the separation metal layer, and a sidewall of the electrode metal layer.

7. The semiconductor device of claim 4, wherein the gate dielectric layer further extends along a top surface of the electrode metal layer.

8. The semiconductor device of claim 4, wherein the conductive 2-D material layer is thinner than the separation metal layer.

9. The semiconductor device of claim 4, wherein the conductive 2-D material layer is thinner than the semiconductor 2-D material layer.

10. The semiconductor device of claim 1, wherein the gate dielectric layer is separated from a top surface of the conductive 2-D material layer by the metal stack.

11. A semiconductor device, comprising:
    a substrate;
    a semiconductor 2-D material layer over the substrate;
    a source/drain contact having a bottom layer extending along a source/drain region of the semiconductor 2-D material layer, a middle layer over the bottom layer, and a top layer over the middle layer, wherein the bottom layer of the source/drain contact is made of a 2-D allotrope of group-IV element, and wherein an inner sidewall of the bottom layer, an inner sidewall of the middle layer, and an inner sidewall of the top layer are aligned with each other;
    a gate dielectric layer extending along a channel region of the semiconductor 2-D material layer; and
    a gate electrode over the gate dielectric layer.

12. The semiconductor device of claim 11, wherein the middle layer of the source/drain contact extends along a top surface of the bottom layer, and the middle layer is made of a metal that does not form an alloy with the 2-D allotrope of group-IV element.

13. The semiconductor device of claim 12, wherein the top layer is made of a metal different from the middle layer.

14. The semiconductor device of claim 12, wherein the metal of the middle layer comprises aluminum (Al), bismuth (Bi), cadmium (Cd), chromium (Cr), iridium (Ir), niobium (Nb), plumbum (Pb), tantalum (Ta), tellurium (Te), or tungsten(W).

15. The semiconductor device of claim 11, wherein the gate dielectric layer is in contact with the inner sidewall of the bottom layer, the inner sidewall of the middle layer, and the inner sidewall of the top layer.

16. A semiconductor device, comprising:
    a substrate;
    a semiconductor material over the substrate, wherein the semiconductor material comprises a channel region and a source/drain region;
    a source/drain contact over the source/drain region, wherein the source/drain contact comprises a 2-D material, a separation metal layer over the 2-D material, and an electrode metal layer over the separation metal layer, and the separation metal layer and the 2-D material have substantially a same width;
    a gate dielectric layer over the channel region of the semiconductor material and covering a top surface of the source/drain contact, wherein the gate dielectric layer is in contact with the 2-D material of the source/drain contact; and
    a gate electrode over the gate dielectric layer.

17. The semiconductor device of claim 16, wherein the 2-D material of the source/drain contact comprises stanene or germanene.

18. The semiconductor device of claim 16, wherein the semiconductor material is made of a 2-D material.

19. The semiconductor device of claim 16, wherein the 2-D material of the source/drain contact is in contact with the semiconductor material.

20. The semiconductor device of claim 16, wherein the gate dielectric layer is in contact with a top surface of the electrode metal layer.

\* \* \* \* \*